(12) United States Patent
Benett et al.

(10) Patent No.: US 6,897,557 B2
(45) Date of Patent: May 24, 2005

(54) INTEGRATED ELECTRICAL CONNECTOR

(75) Inventors: William J. Benett, Livermore, CA (US); Harold D. Ackler, Sunnyvale, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/885,434

(22) Filed: Jun. 19, 2001

(65) Prior Publication Data

US 2002/0190393 A1 Dec. 19, 2002

(51) Int. Cl.⁷ .......................... H01L 23/52; H01L 23/48; H01L 23/04; H01L 29/40
(52) U.S. Cl. ....................... 257/697; 257/690; 257/692; 257/693; 257/696; 257/698; 257/774
(58) Field of Search .................. 257/634, 669, 257/672, 673, 674, 676, 690, 692, 693, 696, 697, 698, 773, 774, 734; 361/731, 723, 722, 719, 637, 768, 640, 785, 633, 636

(56) References Cited

U.S. PATENT DOCUMENTS

| | | | |
|---|---|---|---|
| 4,342,069 A | * 7/1982 | Link | 361/764 |
| 4,441,119 A | * 4/1984 | Link | 257/666 |
| 4,549,248 A | 10/1985 | Stoll | 361/400 |
| 4,700,214 A | * 10/1987 | Johnson | 257/209 |
| 4,953,060 A | * 8/1990 | Lauffer et al. | 361/710 |
| 5,000,226 A | 3/1991 | Stoll et al. | 137/884 |
| 5,640,995 A | 6/1997 | Packard et al. | 137/597 |
| 6,054,756 A | * 4/2000 | DiStefano et al. | 257/668 |

OTHER PUBLICATIONS

Merriam–Webster's Collegiate Dictionary 10th Edition, 2001, pp. 445 & 993.*
H. Okuyama et al; "Development of Microconnector with Automatic Connecting/Disconnecting Mechanism" Twelfth IEEE International Conference on Micro ElectroMechanical Systems, Orlando, Florida, Jan. 17–21, 1999.

* cited by examiner

Primary Examiner—Nathan J. Flynn
Assistant Examiner—Victor A. Mandala, Jr.
(74) Attorney, Agent, or Firm—James S. Tak; Alan H. Thompson; Eddie E. Scott

(57) ABSTRACT

An electrical connector is formed from a sheet of electrically conductive material that lies in between the two layers of nonconducting material that comprise the casing of an electrical chip. The connector is electrically connected to an electrical element embedded within the chip. An opening in the sheet is concentrically aligned with a pair of larger holes respectively bored through the nonconducting layers. The opening is also smaller than the diameter of an electrically conductive contact pin. However, the sheet is composed flexible material so that the opening adapts to the diameter of the pin when the pin is inserted therethrough. The periphery of the opening applies force to the sides of the pin when the pin is inserted, and thus holds the pin within the opening and in contact with the sheet, by friction. The pin can be withdrawn from the connector by applying sufficient axial force.

20 Claims, 2 Drawing Sheets ns557 B2

INTEGRATED ELECTRICAL CONNECTOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

The invention relates to an electrical connector and, more particularly, a conducting sheet integrated into an electrical chip and having an opening for making electrical contact with a contact pin inserted therethrough and for holding the pin within the opening.

Micro electrical apparatus are used where a very small size is required, such as in electronic chips and micro fluidic devices. However, their minute dimensions make it very difficult to electrically connect them to related circuitry, other components or power sources. Such connections are typically made using conductive epoxy or solder, both of which are very difficult to microscopically apply with precision. The inaccuracy and error inherent in applying epoxy and solder to microscopic areas can result in short circuits or unintended connections. Furthermore, the foregoing connections are rigid and fixed, making the repair or replacement of components time consuming and difficult.

One approach to this problem is to fabricate an electrical interface that is compatible with the two electrical elements being connected. However, the interface is typically larger than the micro device being connected, and thus compromises the advantage in size otherwise gained by using such a device.

As may be seen from the foregoing, there presently exists a need in the art for an electrical connector which is minute and provides for easy connection and disconnection, while not being prone to causing a short circuit or other unintended electrical connection while being connected or disconnected. The present invention fulfills this need in the art.

SUMMARY OF THE INVENTION

Briefly, the present invention is an electrical connector that is an integral part of an electrical chip and is electrically connected to one or more electrical elements embedded therein. The connector is formed from a sheet of electrically conductive material that lies in between and is held in place by nonconducting layers of material that form the casing of the chip. The connector provides an electrical connection between the chip and external circuitry, electrical components, or a power source; reliably maintains the connection; and allows the chip to be quickly disconnected when desired.

An opening in the sheet is concentrically aligned with a pair of larger holes respectively bored through the nonconducting layers composing the chip casing. The opening and holes are sized to accept a conductive contact pin to be inserted therethrough when the chip is to be electrically connected to the device or component that is electrically connected to or a part of the contact pin. The minimum breadth of the opening is smaller than the diameter of the contact pin and the sheet is composed flexible material so that the opening adapts to the diameter of the contact pin when the pin is inserted therethrough. Moreover, the periphery of the opening applies a normal force to the sides of the contact pin when the pin is inserted, and thus holds the pin within the opening by friction. This maintains the electrical connection.

Metal lines buried in the chip connect the connector to an electrical element embedded within the chip. The pin can be withdrawn from the connector by applying sufficient axial force. The chip can thus be easily disconnected from the external components or elements electrically connected to the contact pin.

Where a chip contains a plurality of electrical elements, a connector for each of the elements is formed from the sheet. The connectors are electrically isolated from each other, and each is electrically connected, respectively, to an electrical element embedded in the chip. Each of the openings is respectively aligned with a pair of holes in the layers comprising the chip casing. The contact pins are attached together by a harness so that all of the pins can be simultaneously inserted, or disconnected, in one step. The harness is held in place by the friction applied by the connectors against the respective contact pins.

The electrical connector of the invention obviates the need for using epoxy, solder, or a bulky electrical interface to electrically connect a chip with other electrical components or circuitry, and provides for easy disconnection. As the chip is of times an integral part of a micro electromechanical or microfluidic system, the connector of the present invention allows standard hardware to be used to mechanically connect the system that includes the chip to other devices at the same time the electrical connection is being made. The present invention thus allows the use of standard connecting hardware originally designed for semiconductor integrated circuits such as dual inline sockets and pin grid arrays, as well as connecting hardware designed to make fluid or fiber optic connections with the chip.

These and other features, aspects and advantages of the present invention will become better understood with reference to the following drawings, description and claims.

DETAILED DESCRIPTION OF THE INVENTION

Figure 1:
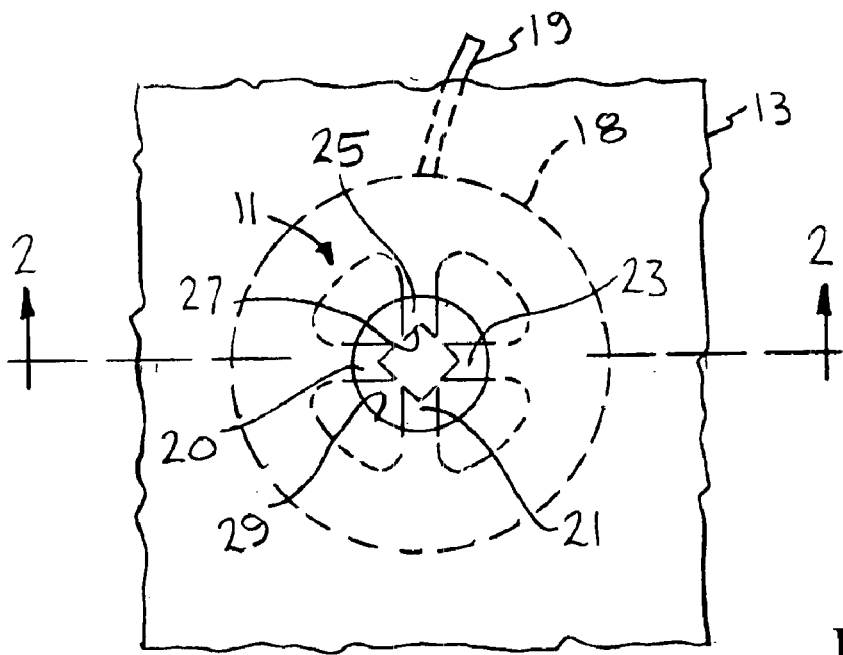
FIG. 1 is a top view of the electrical connector of the present invention embedded within an electrical chip.
Figure 2:
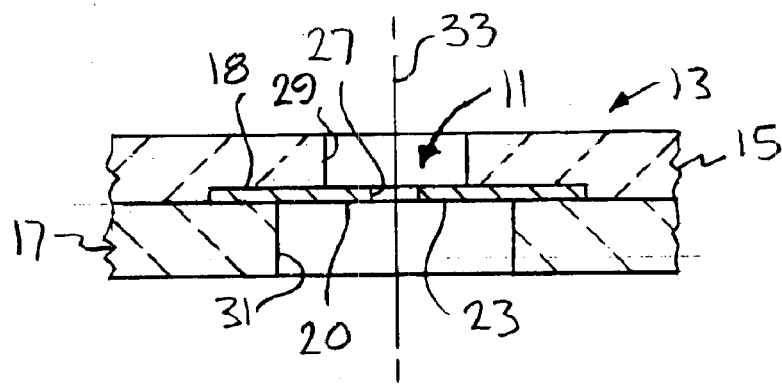
FIG. 2 is a side sectional view of the electrical connector of the present invention, taken along line 2—2 of FIG. 1.

Turning to the drawings, FIG. 1 shows a top view of connector 11 of the present invention located within chip 13. As shown in the side section view provided by FIG. 2, chip 13 is comprised of top layer 15 and bottom layer 17. Both layers are composed of ceramic, nonconductive material. Sheet 18 is sandwiched in between top layer 15 and bottom layer 17, and is composed of flexible conductive material, such as beryllium copper. To give an idea of scale, chip 13 is 0.5 to 2.0 mm thick, and sheet 18 is 0.05 to 0.2 mm thick. Connector 11 is formed from sheet 18. Sheet 18, and thus connector 11, is electrically connected to an electrical element (not shown) embedded within chip 13 by means of wire 19.

Connector 11 includes centripetal fingers 20, 21, 23 and 25 that converge to form opening 27. Opening 27 is a polygon having a maximum breadth and a minimum breadth. Top layer 15 includes hole 29, and bottom layer 17 includes hole 31. Hole 29 has a diameter greater than the maximum breadth of opening 27, and hole 31 has a diameter greater than that of hole 29. Opening 27, hole 29, and hole 31 are concentric, and share axial centerline 33.

Alternatively, opening 27 may be a shape other than a polygon, e.g., a circle, an ellipse or a slit. If a circle, the diameter of opening 27 would be less than the diameter hole 29.

Figure 3:
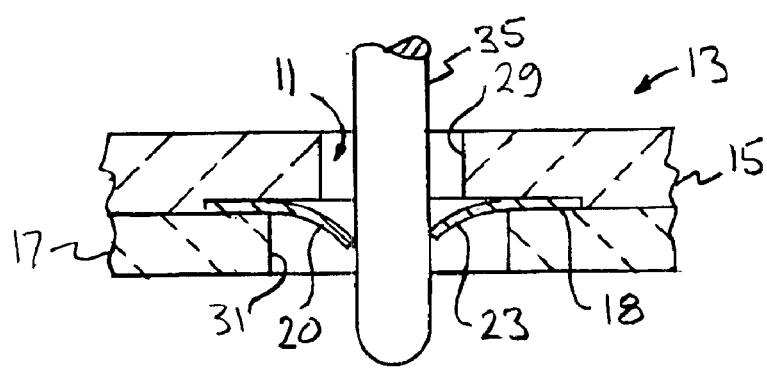
FIG. 3 is the side sectional view of the electrical connector of the present invention shown in FIG. 3, with a contact pin inserted therethrough.

Cylindrical contact pin 35 is electrically conductive, and is connected to an electrical device (not shown) external to chip 13. Pin 35 has a diameter greater than the original, unstressed minimum breadth of opening 27, and less than that of hole 29. As illustrated in FIG. 3, when pin 35 is inserted through opening 27, it stresses opening 27 by forcing the centrifugal bending of flexible fingers 20, 21, 23 and 25, thereby increasing the minimum breadth of opening 27 until it equals the diameter of pin 35. This causes the unsupported ends of fingers 20, 21, 23 and 25 to contact and exert a normal force against the lateral side of pin 35. As shown in FIG. 3, the bending of the fingers 20, 23, (and 21, 25 not shown) involves a cantilever-like deflection, i.e. a deflection which produces a curvilinear contour of the cantilever when a load or force is exerted at an unsupported end in a transverse direction to a central axis of the cantilever.

When an axial force is applied to pin 35 in a direction that would withdraw it from opening 27, the normal force generates a frictional force opposing such a withdrawal force. This frictional force tends to hold pin within opening 27 and restrain it from being withdrawn. At the same time, the contact between fingers 20, 21, 23 and 25, and pin 35 establishes an electrical connection between connector 11 and pin 35, and thus between the electrical element in chip 13 connected to connector 11 and the electrical device connected to pin 35.

Figure 4:
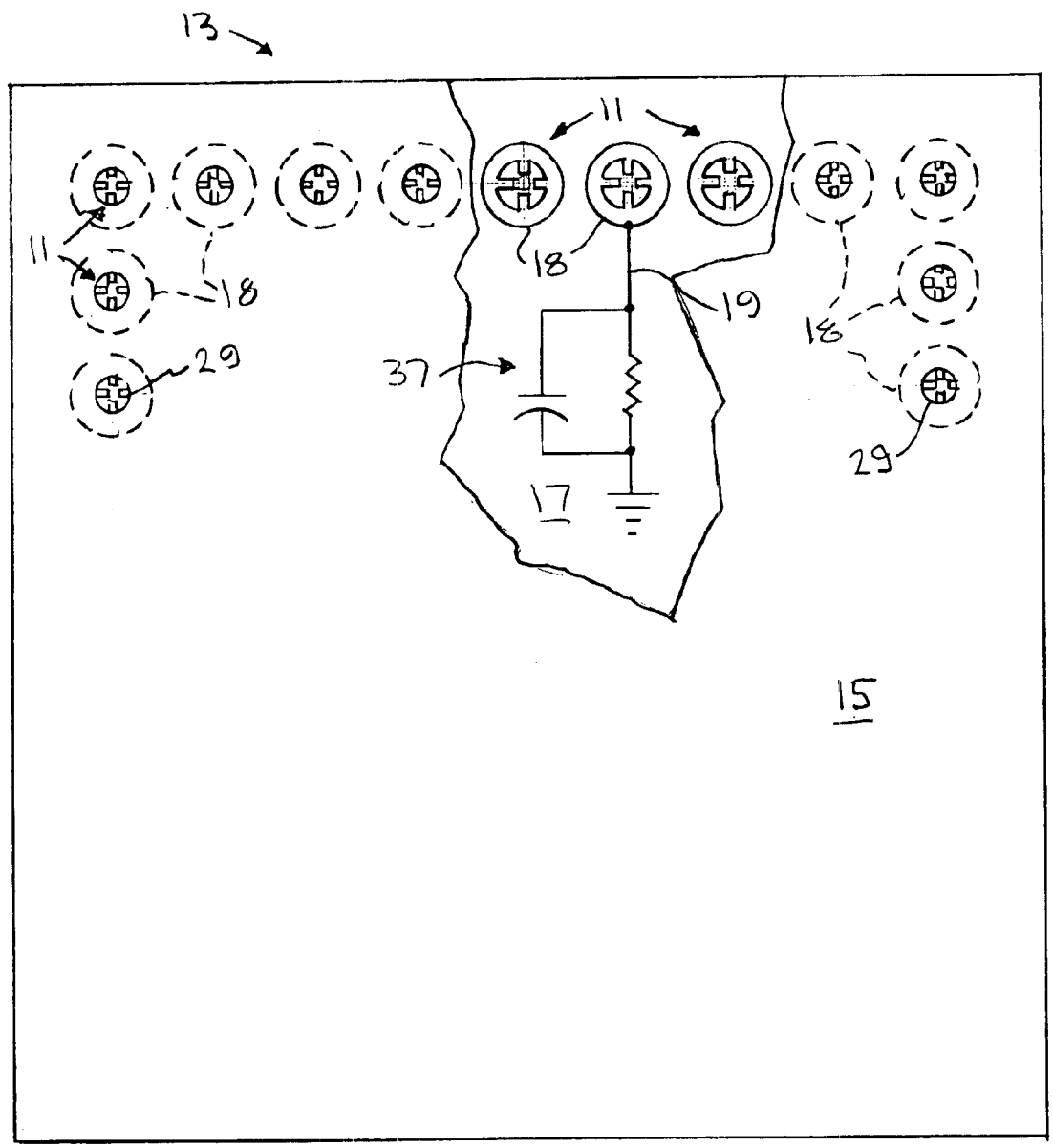
FIG. 4 is a top view of a chip including a plurality of the electrical connectors of the present invention. Part of the top layer is cut away to show the underlying connectors.

As shown in the top view provided by FIG. 4, chip 13 may contain a plurality of connectors 11, with each connector 11 being connected to an electrical element embedded within chip 13. For example, one of connectors 11 is shown connected to element 37. This configuration allows the simultaneous connection of a number of elements within chip 13 to a plurality of pins 35, and hence to a plurality of electrical devices or components external to chip 13, respectively. More particularly, pins 35 are attached to a rigid harness (not shown). Pins 35 are spatially arranged so that each pin 35 will be simultaneously inserted into a respective opening 27 when the harness is positioned adjacent to or abutting chip 13. In addition to preventing the translation of pins 35 with respect to chip 13 and maintaining the electrical connection of pins 35 and the elements embedded within chip 13, this configuration prevents the rotation of pins 35 and the harness with respect to chip 13.

It is to be understood, of course, that the foregoing description relates to several embodiments of the invention and that modifications may be made without departing from the sprit and scope of the invention as set forth in the following claims.

What is claimed is:

1. A connector chip for electrically connecting a conductive contact pin thereto, comprising:
    a nonconducting top layer;
    a nonconducting bottom layer;
    a conductive sheet situated between the top layer and the bottom layer; and
    a passageway extending at least partially through the chip, the passageway including flexible cantilever means centripetally extending into the passageway for holding the pin in contact with the sheet and for restraining the pin from translating with respect to the chip, said flexible cantilever means being curvilinearly deflectable by the pin in the direction of pin insertion into the passageway so as to produce a normal force against a lateral side of the pin and an associated frictional force which resists withdrawal of the pin from the passageway.

2. The electrical connector chip as defined in claim 1 comprising means for preventing rotation of the pin with respect to the chip.

3. The electrical connector chip as defined in claim 1 further comprising:
    a plurality of passageways through the chip; and
    a harness including a plurality of the pins spatially arranged so that each of the pins can be simultaneously aligned with one of the passageways, respectively, whereby
    all of the pins can be simultaneously inserted into passageways, respectively, and
    the harness is prevented from translating or rotating relative to the chip by the holding means when the contact pins are respectively inserted into the passageways.

4. The electrical connector chip as defined in claim 3 wherein:
    each cantilever means is electrically isolated from the other cantilever means and is electrically connected to a respective chip element, whereby
    each chip element is electrically connected to a respective contact pin when the contact pins are respectively inserted into the passageways.

5. A connector chip for electrically connecting a conductive contact pin thereto, comprising:
    a nonconducting top layer;
    a nonconducting bottom layer;
    a conductive sheet situated between the top layer and the bottom layer; and a passageway extending at least partially through the chip, the passageway including flexible cantilever means for holding the pin in contact with the sheet and for restraining the pin from translating with respect to the chip, said flexible cantilever means being curvilinearly deflectable by the pin so as to produce a normal force against a lateral side of the pin and an associated frictional force which resists withdrawal of the pin from the passageway.
    wherein the flexible cantilever means is a plurality of fingers formed from the sheet and extending centripetally into the passageway to respective unsupported ends, and
    the passageway includes an opening through the sheet formed by the plurality of unsupported ends, with the opening having a breadth that varies responsive to the contact pin being inserted therethrough.

6. The electrical connector chip as defined in claim 5 wherein:
    the passageway is further comprised of a top hole through the top layer, and a bottom hole through the bottom layer; and the top hole, the bottom hole and the opening are aligned.

7. The electrical connector chip as defined in claim 6 wherein:
    the breadth varies between an unstressed minimum breath and a stressed breath, with the stressed breath being greater than the unstressed minimum breath;

the contact pin has a diameter greater that the unstressed minimum breadth; and the breadth increases to the stressed breadth in response to the contact pin being inserted into the opening.

8. The electrical connector chip as defined in claim 7 wherein:

the top hole has a top hole diameter and the bottom hole has a bottom hole diameter; and the top hole diameter is smaller that the bottom hole diameter.

9. A connector chip for electrically connecting a conductive contact pin thereto, comprising:

a nonconducting top layer;

a nonconducting bottom layer;

a conductive sheet situated between the top layer and the bottom layer; and a passageway extending at least partially through the chips the passageway including flexible cantilever means for holding the pin in contact with the sheet and for restraining the pin from translating with respect to the chip, said flexible cantilever means being curvilinearly deflectable by the pin so as to produce a normal force against a lateral side of the pin and an associated frictional force which resists withdrawal of the pin from the passageway, wherein the chip is from 0.5 to 2.0 millimeters thick; and the sheet is from 0.05 to 0.2 millimeters thick.

10. A connector chip for electrically connecting a conductive contact pin thereto, comprising:

a nonconducting top layer;

a nonconducting bottom layer;

an electrical element; and a conductive sheet situated between the top layer and the bottom layer, and being electrically connected to the element;

the top layer having a top hole therethrough, and the bottom layer having a bottom hole therethrough, with the top hole and the bottom hole being in alignment and comprising an aligned hole pair;

the sheet having a plurality of flexible cantilevered fingers each centripetally extending to respective unsupported ends to form an opening aligned with the aligned hole pair, and each being curvilinearly deflectable by the pin when inserted into the opening, with said unsupported ends applying a normal force against the pin when curvilinearly deflected, for generating a frictional force which resists withdrawal of the pin and holds the pin in contact with the sheet, whereby the pin is prevented from translating with respect to the chip and an electrical connection between the pin and the element is established and maintained.

11. The electrical connector chip as defined in claim 10 wherein:

the chip is from 0.5 to 2.0 millimeters thick; and the sheet is from 0.05 to 0.2 millimeters thick.

12. The electrical connector chip as defined in claim 10 comprising:

a plurality of the aligned hole pairs and openings; and a harness including a plurality of the pins spatially arranged so that each of the contact pins can be simultaneously aligned with one of the aligned hole pairs and openings, whereby each of the contact pins can be simultaneously inserted into one of the aligned hole pairs and openings, respectively, and the harness is held stationary relative to the chip by the flexible cantilevered fingers when the pins are inserted.

13. A method for electrically connecting a chip and a conductive contact pin, comprising mechanically holding the pin in a passageway in the chip by the curvilinear deflection, in the direction of pin insertion into the passageway, of a flexible cantilever means centripetally extending into the passageway wherein the curvilinear deflection of the flexible cantilever means produces a normal force against the pin and an associated frictional force to resist withdrawal of the pin, and wherein the mechanical hold establishes and maintains an electrical connection between the pin and an electrical element embedded in the chip.

14. A method for electrically connecting a chip and a conductive contact pin, comprising:

mechanically holding the pin in a passageway in the chip by the curvilinear deflection of a flexible cantilever means when the pin is inserted into the passageway wherein the curvilinear deflection of the flexible cantilever means produces a normal force against the pin and an associated frictional force to resist withdrawal of the pin, and wherein the mechanical hold establishes and maintains an electrical connection between the pin and an electrical element embedded in the chip, and additionally providing the chip with a flexible conductive sheet electrically connected to the electrical element and having a plurality of flexible cantilevered fingers centripetally extending to respective unsupported ends to form an opening aligned with the passageway, wherein the electrical connection is maintained and the normal force is applied by inserting the pin into the opening and curvilinearly deflecting the opening.

15. The connecting method recited in claim 14 comprising:

providing a plurality of passageways and openings; and attaching a plurality of the pins to a rigid harness and spatially arranging the pins so that each of the pins can be simultaneously inserted into one of the passageways and the opening aligned therewith.

16. A connector of a chip of a type having a passageway extending at least partially therethrough, for electrically connecting a conductive contact pin to the chip, the connector comprising:

a conductive sheet having a peripheral portion connected to the chip adjacent the passageway, and flexible cantilever means centripetally extending from the peripheral portion into the passageway to at least one unsupported end, said flexible cantilever means being curvilinearly deflectable by the pin in the direction of pin insertion into the passageway so as to produce a normal force against the pin and an associated frictional force which resists withdrawal of the pin from the passageway for holding a pin in contact with the sheet and for restraining the pin from translating with respect to the chip.

17. The electrical connector as defined in claim 16 comprising means for preventing rotation of the pin with respect to the chip.

18. A connector of a chip of a type having a passageway extending at least partially therethrough, for electrically connecting a conductive contact pin to the chip, the connector comprising:

a conductive sheet having a peripheral portion connected to the chip adjacent the passageway, and flexible cantilever means extending from the peripheral portion into the passageway to at least one unsupported end, said flexible cantilever means being curvilinearly deflectable by the pin so as to produce a normal force against the pin and an associated frictional force which resists withdrawal of the pin from the passageway for holding a pin in contact with the sheet and for restraining the pin from translating with respect to the chip, wherein the flexible cantilever means is a plurality of fingers formed from the sheet and extending centripetally into the passageway to respective unsupported ends to form an opening through the sheet; and the opening has a breadth that varies responsive to the contact pin being inserted therethrough.

19. The electrical connector as defined in claim 18 wherein:

the breadth varies between an unstressed minimum breath and a stressed breath, with the stressed breath being greater than the unstressed minimum breath;

the contact pin has a diameter greater that the unstressed minimum breadth; and the breadth increases to the stressed breadth in response to the contact pin being inserted into the opening.

20. A connector of a chip of a type having a passageway extending at least partially therethrough, for electrically connecting a conductive contact pinto the chip, the connector comprising:

a conductive sheet having a peripheral portion connected to the chip adjacent the passageway, and flexible cantilever means extending from the peripheral portion into the passageway to at least one unsupported end, said flexible cantilever means being curvilinearly deflectable by the pin so as to produce a normal force against the pin and an associated frictional force which resists withdrawal of the pin from the passageway for holding a pin in contact with the sheet and for restraining the pin from translating with respect to the chip, wherein the sheet is from 0.05 to 0.2 millimeters thick.

* * * * *